(12) United States Patent
Witte et al.

(10) Patent No.: US 8,367,519 B2
(45) Date of Patent: Feb. 5, 2013

(54) METHOD FOR THE PREPARATION OF A MULTI-LAYERED CRYSTALLINE STRUCTURE

(75) Inventors: Dale A. Witte, Wentzville, MO (US); Jeffrey L. Libbert, O'Fallon, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 12/974,772

(22) Filed: Dec. 21, 2010

(65) Prior Publication Data
US 2011/0159665 A1    Jun. 30, 2011

Related U.S. Application Data

(60) Provisional application No. 61/290,961, filed on Dec. 30, 2009.

(51) Int. Cl.
*H01L 21/18* (2006.01)
*H01L 21/762* (2006.01)

(52) U.S. Cl. .......................... 438/458; 438/517; 438/526

(58) Field of Classification Search .................. 438/458, 438/763, 381, 149; 257/E21.09, 618
See application file for complete search history.

(56) References Cited

U.S. PATENT DOCUMENTS

| | | | |
|---|---|---|---|
| 6,930,375 B2 | 8/2005 | Falster et al. | |
| 7,071,080 B2 | 7/2006 | Falster et al. | |
| 7,135,351 B2 | 11/2006 | Binns et al. | |
| 2004/0077184 A1 | 4/2004 | Anderson et al. | |
| 2005/0014346 A1* | 1/2005 | Mitani et al. | 438/459 |
| 2005/0170611 A1 | 8/2005 | Ghyselen et al. | |
| 2006/0185582 A1* | 8/2006 | Atwater et al. | 117/89 |
| 2007/0041566 A1 | 2/2007 | Praturi et al. | |
| 2007/0117350 A1 | 5/2007 | Seacrist et al. | |
| 2007/0232025 A1* | 10/2007 | Moriceau et al. | 438/458 |
| 2007/0281399 A1* | 12/2007 | Cites et al. | 438/149 |
| 2009/0120568 A1* | 5/2009 | Deguet et al. | 156/250 |
| 2009/0149001 A1* | 6/2009 | Cites et al. | 438/458 |
| 2010/0127353 A1* | 5/2010 | Letertre et al. | 257/615 |
| 2010/0213578 A1* | 8/2010 | Sandhu et al. | 257/618 |
| 2010/0216295 A1* | 8/2010 | Usenko | 438/470 |

FOREIGN PATENT DOCUMENTS

| | | |
|---|---|---|
| EP | 1763069 A1 | 3/2007 |
| FR | 2913528 A1 | 9/2008 |
| WO | 02054466 A1 | 7/2002 |

OTHER PUBLICATIONS

D.V. Singh, L. Shi, K.W. Guarini, P.M. Mooney, S.J. Koester, and A. Grill; Article; High-Quality Crystalline Layer Transfer from a Silicon-on-Insulator Substrate onto a Sapphire Substrate Using Wafer Bonding; Electronic Materials vol. 32, No. 11, pp. 1339-1343, 2003.
PCT International Search Report and Written Opinion of the International Search Authority mailed on Mar. 4, 2011 regarding PCT/US2010/061858 filed on Dec. 22, 2010, 9 pgs.

* cited by examiner

*Primary Examiner* — Olik Chaudhuri
*Assistant Examiner* — Wilner Jean Baptiste
(74) *Attorney, Agent, or Firm* — Armstrong Teasdale LLP

(57) ABSTRACT

This invention generally relates to a process for making a multi-layered crystalline structure. The process includes implanting ions into a donor structure, bonding the implanted donor structure to a second structure to form a bonded structure, cleaving the bonded structure, and removing any residual portion of the donor structure from the finished multi-layered crystalline structure.

29 Claims, 2 Drawing Sheets

METHOD FOR THE PREPARATION OF A MULTI-LAYERED CRYSTALLINE STRUCTURE

CROSS-REFERENCE TO RELATED APPLICATIONS

This application claims the benefit of U.S. Provisional Application No. 61/290,961, filed Dec. 30, 2009, which is incorporated herein by reference in its entirety.

FIELD OF THE INVENTION

The present invention relates generally to a process for the preparation of a multi-layered crystalline structure.

BACKGROUND OF THE INVENTION

Multi-layered structures comprising a device layer with a device quality surface, such as a silicon-geranium or sapphire layer, and a silicon substrate that has a different crystal lattice structure than the material of the device layer are useful for a number of different purposes. These multi-layered structures typically comprise multiple layers of material having differing coefficients of thermal expansion. During manufacture of such structures, however, the different rates of thermal expansion can create very large stresses in the multilayered structures when they are heated, which can fracture the device layer or substrate. This places severe constraints on the maximum temperature that these dissimilar pairs can be exposed to during manufacture.

Multi-layered structures comprising a device quality layer bonded to a substrate may be fabricated or manufactured in a number of ways. For example, in one approach, the multi-layered structure may be formed by direct layer transfer. In this process, an implanted wafer is bonded directly to the substrate, subjected to a low temperature anneal, and cleaved thermally and/or mechanically to result in a thin, but rough, layer on the surface of the substrate. The rough layer must then be smoothed. Some degree of smoothing may be done using a chemo-mechanical polishing step at relatively low temperatures. However, chemo-mechanical polishing is generally not suitable to achieve the uniformity required for state of the art multilayered structures and is therefore not desirable. Thermal methods may also be used to thin and smooth a wafer surface; however, while thermal methods easily achieve film target thicknesses, uniformity, and smoothness, they require that the wafer be heated to high temperatures, which damage the crystallinity of the film due to the aforementioned stresses.

Another method by which such multi-layered structures may be fabricated or manufactured while solving the smoothing problem includes bonding a silicon on insulator wafer to the dissimilar substrate and subjecting both to a low temperature bond strengthening anneal. (See, e.g., D.V. Singh, L. Shi, K. W. Guarni, P. M. Mooney, S. J. Koester, and A. Grill, "Electronic Materials" Vol. 32, no. 11, pg. 1339, 2003). The handle wafer may then be ground or etched down to the BOX layer and the BOX layer is removed by a hydrofluoric etch. The exposed silicon layer surface then has the same thickness as the starting silicon-on-insulator wafer and the finally exposed surface has roughness similar to a polished surface with no chemo-mechanical polishing or thermal step needed. Preparing a multi-layer structure in this way, however, is not without problems. For example, as the entire handle wafer must be ground or etched away, the process can become both time consuming and costly.

SUMMARY OF THE INVENTION

Briefly, therefore, the present invention is directed to a method for the preparation of a multi-layered crystalline structure. The method comprises implanting ions selected from the group consisting of hydrogen, helium and combinations thereof into a donor structure. The donor structure comprises a central axis and a device layer having an implantation surface and device surface which are generally perpendicular to the central axis and an average thickness, t, extending in the axial direction from the implantation surface to the device surface of the device layer. The donor structure further comprises a handle layer and an intervening layer, which is positioned along the central axis of the donor structure between the device surface and the handle layer. The ions are implanted into the donor structure through the implantation surface to an implantation depth, D1, which is greater than the thickness, t, of the device layer to form, in the implanted donor structure, a damage layer which is generally perpendicular to the axis and located in the intervening layer and/or in the handle layer. The method further comprises bonding the implanted donor structure to a second structure to form a bonded structure, cleaving the donor structure along the damaged layer to form a multi-layered crystalline structure comprising the second structure, the device layer and residual material, the residual material comprising at least a portion of the intervening layer and optionally a portion of the handle layer, and removing the residual material from the multi-layered crystalline structure.

In another aspect, the current invention is directed to a method for the preparation of a multi-layered microelectric device. The method comprises providing a microelectric device and bonding the microelectric device to the multi-layered crystalline structure formed by the process described above.

Other objects and features of this invention will be in part apparent and in part pointed out hereinafter.

BRIEF DESCRIPTION OF THE DRAWINGS

Corresponding reference characters indicate corresponding parts throughout the drawings.

DETAILED DESCRIPTION OF THE PREFERRED EMBODIMENTS

Figure 1A:
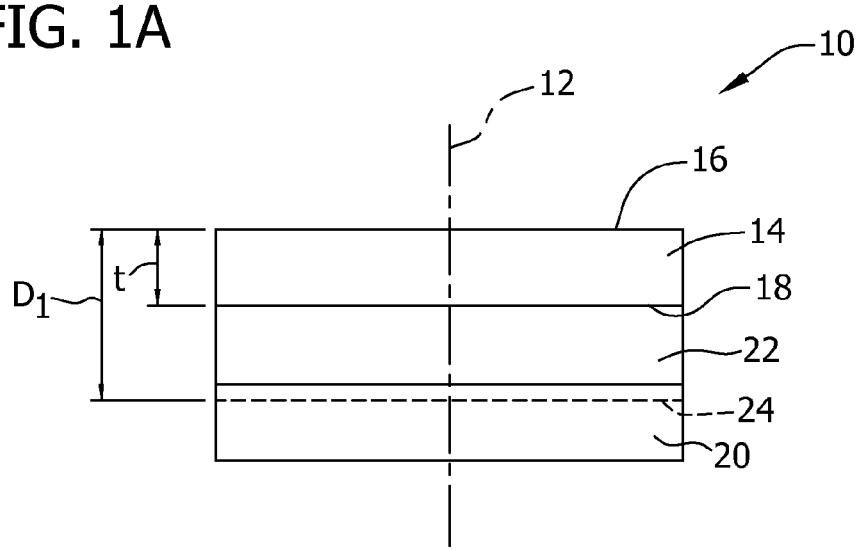
FIG. 1A is a cross-sectional, schematic drawing of a donor structure 10 comprising a device layer 14, a handle layer 20, and an intervening layer 22. The dashed line 24 in the handle layer 20 represents a damage layer 24, present therein.

In accordance with the present invention, an improved process for making a multi-layered crystalline structure has been discovered. More specifically, it has been discovered that the use of layer transfer and chemical etching techniques provides an improved method for more efficiently producing a multi-layered crystalline structure. In accordance with the invention, the donor structure may be any structure generally comprising at least a device layer, a handle wafer, and an intervening layer disposed therebetween. Advantageously, the handle wafer of the donor structure may be recycled multiple times. For exemplary purposes herein, the donor structure is a silicon-on-insulator structure.

It is to be noted that the silicon-on-insulator structure used for the donor structure in the exemplary embodiment of the instant invention may be formed by known processes. Such processes include, for example, SOI formation by oxygen implantation (Simox), bonding a semiconductor wafer to an oxidized handle and grinding/etching a portion of the semiconductor wafer away (BESOI), or bonding and layer transfer techniques described in U.S. Patent Application Publication Nos. 2007/0041566 and 2007/0117350, the entire contents of which are incorporated herein by reference for all purposes. Preferably, the process of the present invention utilizes wafer bonding and layer transfer techniques to prepare the donor structure. The present invention will therefore be set forth in greater detail below in the context of these techniques. It is to be understood, however, that this is for purposes of illustration and should not be viewed in a limiting sense. It is to be further understood that, in the practice of the present invention, these techniques may be suitably carried out using a variety of apparatus and process conditions well-known in the art and, in some instances, may be omitted or combined with other techniques and conditions without departing from the scope of the present invention.

1. Formation of the Multi-Layered Crystalline Structure

The multi-layered crystalline structure of the present invention may be prepared by implanting ions into a donor structure comprising a device layer, a handle layer and an intervening layer, bonding the donor structure to a second structure to form a bonded structure, cleaving a portion or all of the handle layer and optionally a portion of the intervening layer from the device layer which remains bonded to the second structure and optionally etching a portion or all of the remaining handle layer and/or intervening layer from the device layer thereby exposing the device layer. In one embodiment, the first structure (referred to herein as the "donor structure") is an SOI structure, and the second structure is a sapphire wafer.

The donor structure provides the device layer for the final multi-layered crystalline structure. The other substrate will be referred to hereinafter as the "second structure." The second structure may be comprised of sapphire, quartz crystal, silicon carbide, silicon, or glass. In one alternative embodiment, an amount of a bonding layer is disposed on at least one of the donor structure or the second structure prior to bonding the donor structure to the second structure.

A. Donor Structure

Referring now to FIG. 1A, the donor structure 10 comprises a central axis 12 and a device layer 14, wherein the device layer 14 comprises an implantation surface 16 and a device surface 18. The implantation surface 16 and device surface 18 are generally perpendicular to the central axis 12. An average thickness, t, extends in the axial direction from the implantation surface 16 to the device surface 18 of the device layer 14. The donor structure 10 further comprises a handle layer 20 and an intervening layer 22, which is positioned along the central axis 12 of the donor structure 10 between the device surface 18 and the handle layer 20.

The device layer comprises any material suitable for use in the production of microelectronic or photovoltaic devices. The device layer typically comprises a material selected from the group consisting of silicon, silicon carbide, sapphire, germanium, silicon germanium, gallium nitride, aluminum nitride, or any combination of these. In one preferred embodiment, the device layer comprises silicon.

In general, the device layer has an average thickness, t, which is suitable for use in the production of microelectronic or photovoltaic devices; however the device layer may have a thickness greater than those typically used without departing from the scope of the present invention. Generally, the device layer has an average thickness, t, of at least about 20 nm, typically at least about 90 nm and may have a thickness, t, of from about 20 nm to about 500 nm.

The intervening layer may be any material capable of adhering to both the device layer and handle layer and which may be permeated by ion implantation. Typically, the intervening layer is a dielectric layer and comprises a material selected from the group consisting of silicon dioxide and silicon nitride. In general, the intervening layer has an average thickness of at least about 10 nm, typically at least about 500 nm.

The handle layer may be any material upon which an intervening layer may be deposited. In some embodiments of the present invention, ions are implanted into the handle layer. In such embodiments, the handle layer comprises a material suitable for ion implantation and is capable of being cleaved by ion implantation and delamination techniques known in the art. Typically, the handle layer comprises a material selected from the group consisting of silicon, silicon carbide, sapphire, germanium, silicon germanium, gallium nitride, aluminum nitride, gallium arsenic, indium gallium arsenic or any combination thereof.

In general, the handle layer may have any thickness capable of providing sufficient structural integrity to allow delamination of the device layer and at least a portion of the intervening layer and optionally a portion of the handle layer without departing from the scope of the present invention. In general, the handle layer may have an average thickness of at least about 100 microns, typically at least about 200 microns and may have a thickness of from about 100 to about 900 microns, or even from about 500 to about 800 microns.

In some embodiments, the donor structure 10 may further include a bonding layer, such as an oxide layer, deposited oxides, TEOS, CVD nitrides, or organic adhesives, that is formed on the implantation surface 16 prior to or after the implantation of ions into the donor structure 10 and/or prior to the bonding of the donor structure 10 to the second structure 26. Alternatively or in addition, a bonding layer may be formed on the second structure prior to bonding. The application of the bonding layer provides a bonding interface between the donor structure 10 and the second structure 26 so as to prevent the formation of interfacial gaps that may occur during direct bonding of the donor structure 10 and the second structure 26. While not required, when present, the bonding layer may have an average thickness of at least 10 nm, and may have an average thickness of at least about 1 micron, at least about 3 microns or greater.

It should be noted that any technique generally known in the art may be used to form the donor structure. For example, the donor structure may be formed using a layer transfer process, a back side etch process, or a SIMOX process.

It should be further noted that the ranges and minimum thickness values set forth above are not narrowly critical to the invention, so long as the thickness is sufficient to perform a transfer of the device layer to the second structure by any of the aforementioned processes.

Referring again to FIG. 1A, ions, such as hydrogen and/or helium ions, are implanted through the implantation surface 16 at a substantially uniform depth. In the exemplary embodiment, the ions are implanted through the implantation surface 16 and into the handle layer 20 to an implantation depth $D_1$, wherein $D_1$ is greater than the combined thickness of the device layer and the intervening layer. In another embodiment, however, the ions may be implanted through the implantation surface 16 and into the intervening layer 22 such that the ions do not reach the handle layer. It should be noted that in embodiments wherein a bonding layer is deposited on the implantation surface before the implantation takes place, the implantation depth, $D_1$, may be increased to account for the added thickness of the bonding layer. The ion implantation defines a damage layer 24 in the layer in which the ions are implanted. In the exemplary embodiment, as shown in FIG. 1A, the ion implantation defines a damage layer 24 within the handle layer 20.

In general, ions are implanted to an average depth that is sufficient to ensure a satisfactory transfer of the device layer 14 upon a subsequent bonding and cleaving process. Preferably, the implantation depth is minimized to decrease the amount of handle layer 20 and/or intervening layer transferred with the device layer. In general, the ions are implanted to a depth of at least about 200 Angstroms or even at least about 1 micron beneath the implantation surface depending on the thicknesses of the device layer and intervening layer. In some embodiments, the ions may be implanted to a depth of at least about 20 nm, typically at least about 90 nm, at least about 250 nm or even at least about 500 nm. It should be noted, however, that larger implantation depths may be used without departing from the scope of the present invention as they merely increase the amount of intervening layer and/or handle layer that will have to be removed after cleaving to reveal the device layer. As such, it may be preferable to implant the ions to a depth of from about 200 Angstroms to about 1 micron or even from about 20 nm to about 500 nm.

Ion implantation may be achieved using means known in the art. For example, implantation may be achieved in a manner according to the process of U.S. Pat. No. 6,790,747, the entire contents of which are incorporated herein by reference. In some embodiments, an energy of, for example, at least about 10 keV, at least about 20 keV, at least about 80 keV, or at least about 120 keV may be used to implant hydrogen at a dosage of at least about $1 \times 10^{16}$ ions/cm$^2$, at least about $2 \times 10^{16}$ ions/cm$^2$, at least about $1 \times 10^{17}$ ions/cm$^2$, or even at least about $2 \times 10^{17}$ ions/cm$^2$. Typically, the concentration of hydrogen implanted may be from about $2 \times 10^{16}$ ions/cm$^2$ to about $6 \times 10^{16}$ ions/cm$^2$. It should be noted, that hydrogen may be implanted as $H_2^+$ or alternatively as $H^+$ without departing from the scope of the present invention.

In other embodiments, an energy of, for example, at least about 10 keV, at least about 20 keV, or at least about 30 keV, at least about 50 keV, at least about 80 KeV or even at least about 120 keV may be used to implant helium at a dosage of at least about $5 \times 10^{15}$ ions/cm$^2$, at least about $1 \times 10^{16}$ ions/cm$^2$, at least about $5 \times 10^{16}$ ions/cm$^2$, or even at least about $1 \times 10^{17}$ ions/cm$^2$. Typically, the concentration of helium implanted may be from about $1 \times 10^{16}$ ions/cm$^2$ to about $3 \times 10^{16}$ ions/cm$^2$.

In other embodiments, both hydrogen and helium ions are implanted. It should be noted that the implantation of both hydrogen and helium in combination may be done concurrently or sequentially with hydrogen being implanted prior to the helium or alternatively, with helium being implanted prior to the hydrogen. Preferably, the hydrogen and helium are implanted sequentially with the helium being implanted first using at least about 10 keV, at least about 20 keV, or at least about 30 keV, at least about 50 keV, at least about 80 KeV or even at least about 120 keV to implant helium at a dosage of at least about $5 \times 10^{15}$ ions/cm$^2$, at least about $1 \times 10^{16}$ ions/cm$^2$, at least about $5 \times 10^{16}$ ions/cm$^2$, or even at least about $1 \times 10^{17}$ ions/cm$^2$ and then implanting hydrogen at substantially the same depth as the helium using at least about 10 keV, at least about 20 keV, or at least about 30 keV, at least about 50 keV, at least about 80 KeV or even at least about 120 keV to implant hydrogen at a dosage of at least about $5 \times 10^{15}$ ions/cm$^2$, at least about $1 \times 10^{16}$ ions/cm$^2$, at least about $5 \times 10^{16}$ ions/cm$^2$, or even at least about $1 \times 10^{17}$ ions/cm$^2$. In one embodiment, for example, about $1 \times 10^{16}$ He$^+$ ions/cm$^2$ are implanted using about 36 keV into the donor structure after which about $0.5 \times 10^{16}$ H$_2^+$ ions/cm$^2$ are implanted at about 48 keV or alternatively about $1 \times 10^{16}$ H$^+$ ions/cm$^2$ are implanted at about 24 keV are implanted into the donor structure. The specific amount of energy required to perform the implantation of the ions into the donor structure depends on type and form of ion(s) selected, the crystallographic structure of the material through which and into which the ions are being implanted and the desired implantation depth. It should be noted that the implantation may be carried out at any temperature suitable for such implantation. Typically, however, the implantation may be carried out at room temperature. It should be further noted that in this regard, the implantation temperature referred to is the global temperature and that localized temperature spikes may occur at the actual site of the ion beam due to the nature of ion implantation.

After implantation is performed, the donor structure 10 may be thermally treated to begin the formation a cleave plane at the damage layer 24. For example, the donor structure may be thermally treated at a temperature of from about 150° C. to about 375° C. for a period of from about 1 hour to about 100 hours. In an alternative embodiment, as is described below, this thermal treatment may be combined with a thermal treatment performed after the bonding of the donor structure 10 to the second structure 26 so as to simultaneously strengthen the bond between the donor structure 10 and the second structure 26 and begin the formation of the cleave plane at the damage layer 24.

B. Handle Wafer Structure

Figure 1B:
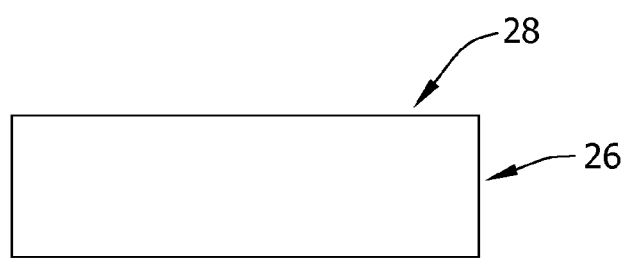
FIG. 1B is a cross-sectional, schematic drawing of a second structure 26, prior to bonding with the donor structure of 1A.

Referring now to FIG. 1B, the second structure 26 comprises either a single wafer or a multi-layer wafer having a bonding surface 28. In the exemplary embodiment, as is shown in FIG. 1B, the second structure 26 is a single wafer. The second structure 26 may be comprised of a material selected from the group consisting of sapphire, quartz crystal, glass, silicon carbide, silicon, gallium nitride, aluminum nitride, gallium aluminum nitride, or any combination thereof. In one preferred embodiment, the second structure 26 comprises a sapphire wafer.

C. Wafer Bonding and Transfer of the Device Layer

Once the donor structure 10 and the second structure 26 have been prepared or selected, forming the final multi-layered crystalline structure comprises transferring the device layer 14 of the donor structure 10 onto the second structure 26. Generally speaking, this transfer is achieved by contacting the implantation surface 16 of the device layer 14 to the bonding surface 28 of the second structure 26 in order to form a single, bonded structure 30 with a bond interface 32 between the two surfaces, and then cleaving or separating the bonded structure along the cleave plane formed along the damage layer 24.

Prior to bonding, the implantation surface 16 and/or the bonding surface 28 may optionally undergo cleaning, a brief etching, and/or planarization to prepare these surfaces for bonding, using techniques known in the art. Without being bound by a particular theory, it is generally believed that the quality of both surfaces prior to bonding will have a direct impact on the quality or strength of the resulting bond interface.

Alternatively or in addition to further conditioning the implantation surface 16 and/or bonding surface 28, a bonding layer may be formed on the implantation surface and/or bonding surface prior to bonding the donor structure to the second structure. It should be noted that when forming a bonding layer on the donor structure, such formation may be performed prior to or after the implantation step. The bonding layer may comprise any material suitable for bonding the donor structure to the second structure including for example an oxide layer such as silicon dioxide, silicon nitride, deposited oxides, such as TEOS, and bonding adhesives. Without being bound by a particular theory, the inclusion of the bonding layer provides a bonding interface between the donor structure 10 and the second structure 26 so as to prevent the formation of interfacial gaps that may occur during direct bonding of the donor structure 10 and the second structure 26. The thermal oxide growth temperature may range from at least about 800° C. to about 1100° C., and the thickness of the bonding layer typically ranges from about 10 nm to about 200 nm. The atmosphere under which the bonding layer is grown typically comprises oxygen, nitrogen, argon, and/or mixtures thereof for dry oxidations and water vapor for wet oxidations. CVD deposited oxides are typically deposited at low temperatures (i.e. from about 400° C. to about 600° C.). Further, some bonding adhesives may be applied at a thickness of at least 1 micron at room temperature, or slightly higher, and then baked or cured at temperatures to approximately 200° C.

The roughness of the surface is one way by which the surface quality is quantitatively measured, with lower surface roughness values corresponding to a higher quality surface. Therefore, the implantation surface 16 of the device layer 14 and/or the bonding surface 28 of the second structure 26 may undergo processing to reduce the surface roughness. For example, in one embodiment, the surface roughness is less than about 5 angstroms. This lowered RMS value can be achieved prior to bonding by cleaning and/or planarization. Cleaning may be carried out according to a wet chemical cleaning procedure, such as a hydrophilic surface preparation process. One common hydrophilic surface preparation process is a RCA SC1 clean process, wherein the surfaces are contacted with a solution containing ammonium hydroxide, hydrogen peroxide, and water at a ratio of, for example, 1:4:20 at about 60° C. for about 10 minutes, followed by a deionized water rinse and spin dry. Planarization may be carried out using a chemical mechanical polishing (CMP) technique. Further, one or both of the surfaces may be subjected to a plasma activation to increase the resulting bond strength before, after, or instead of a wet cleaning process. The plasma environment may include, for example, oxygen, ammonia, argon, nitrogen, diboran, or phosphine. In one preferred embodiment, the plasma activation environment is selected from the group consisting of nitrogen, oxygen, and combinations thereof.

Figure 2:
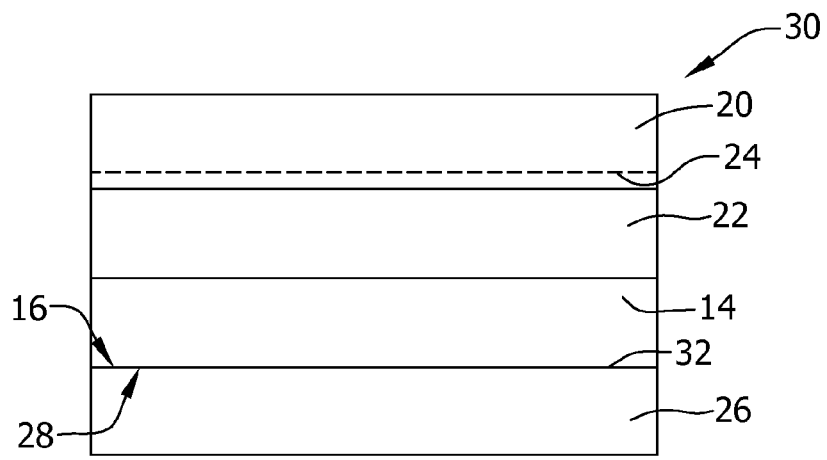
FIG. 2 is a cross-sectional, schematic drawing of a bonded structure 30, resulting from contacting the surface of the device layer 14 of the donor structure (illustrated in FIG. 1A) to the surface of the second structure 26 (illustrated in FIG. 1B).

Referring now to FIG. 2, the donor structure 10 is bonded to the second structure 26 by bringing the implantation surface 16 of the device layer 14 and the bonding surface 28 of the second structure 26 together to form a bond interface 32. Generally speaking, wafer bonding may be achieved using essentially any technique known in the art, provided the energy employed to achieve formation of the bond interface is sufficient to ensure the integrity of the bond interface is sustained during subsequent processing, such as layer transfer by cleaving or separation. Typically, however, wafer bonding is achieved by contacting the surface of the device layer and the second structure at room temperature, followed by a low temperature anneal for a period of time sufficient to produce a bond interface having a bond strength greater than about 500 mJ/m$^2$, about 750 mJ/m$^2$, about 1000 mJ/m$^2$, or more. To achieve such bond strength values, typically heating takes place at temperatures of at least about 200° C., 300° C., 400° C., or even 500° C. for a period of time of at least about 5 minutes, 30 minutes, 60 minutes, or even 300 minutes. As noted above, in one embodiment, this low temperature thermal anneal may be performed in addition to, or in place of, the thermal treatment of the donor structure 10 prior to bonding, which is described above. In an embodiment wherein the donor structure 10 is not thermally annealed prior to bonding, the low temperature thermal anneal of the bonded structure 30 facilitates both the strengthening of the bond interface as well as the formation of the cleave plane that is located along the damage layer 24.

Figure 3:
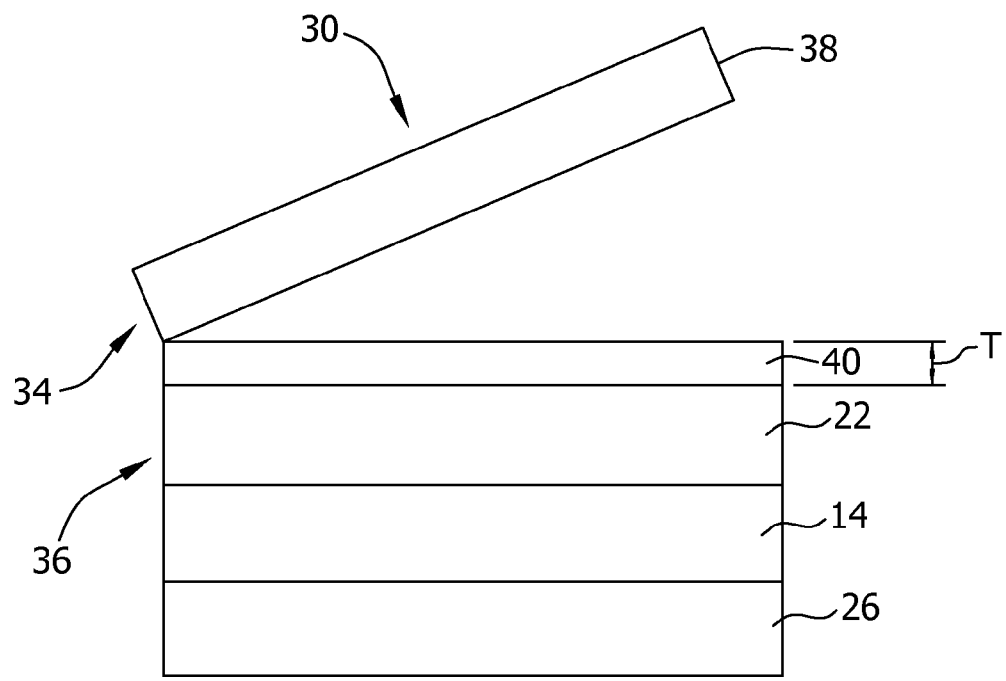
FIG. 3 is a cross-sectional, schematic drawing which illustrates separation of the bonded structure 30 along the damage layer 24 in the handle layer 20, and thus the transfer of the device layer 14, the intervening layer 22, and a residual portion 40 of the handle layer 20 that may optionally be present thereon, to the second structure 26.

Referring now to FIG. 3, after the bond interface 32 has been formed, the resulting bonded structure 30 is subjected to conditions sufficient to induce a fracture along the damage layer 24 within the handle layer 20. Generally speaking, this fracture may be achieved using techniques known in the art, such as by a mechanical or thermal cleave. Typically, however, fracturing is achieved by annealing the bonded structure at an elevated temperature for a period of time to induce fracture. For example, the annealing temperature may be at least about 200° C., at least about 250° C. or higher. In some embodiments, the anneal may even be carried out at temperatures of at least about 350° C., 450° C., 550° C., 650° C., or even 750° C., typically at temperatures of from about 200° C. to about 750° C., and more typically from about 200° C. to about 400° C. It should be noted, however, that because of the differing coefficients of thermal expansion of the various material involve (e.g. silicon and sapphire), it is often preferable to carry out the aforementioned anneal at lower temperatures due to the thermal mismatch between the donor material and the handle. As such the anneal may be preferably carried out using an annealing temperature of from about 200° C. to about 300° C. The anneal is performed over a time period of at least about 5 minutes, 30 minutes, 60 minutes, or even 300 minutes. Higher annealing temperatures will require shorter anneal times, and vice versa. The annealing step can be conducted in an ambient or inert atmosphere, e.g., argon or nitrogen.

In one preferred embodiment, the separation (i.e., fracturing the structure along the damage layer 24 within the handle layer 20) includes the application of mechanical force, either alone or in addition to the annealing process. The actual means of applying such a mechanical force is not critical to this invention; i.e., any known method of applying a mechanical force to induce separation in a semiconductor structure may be employed, so long as substantial damage to the device layer is avoided.

Referring again to FIG. 3, two structures (34 and 36) are formed upon separation. If the separation of the bonded structure 30 occurs along the damage layer 24 in the handle layer 20, and the cleave plane does not coincide with the bond interface 32, but rather is present in the handle layer 20, a portion of the handle layer is part of both structures (i.e., a portion of the handle layer is transferred along with the intervening layer 22 and device layer 14). In the exemplary embodiment, structure 34 comprises some portion 38 of the handle layer 20. Structure 36 comprises the second structure 26, the device layer 14, the intervening layer 22, and a residual portion 40 of the handle layer 20 on the surface thereof. In an alternative embodiment, wherein the ions are implanted to a depth so as to form the damage layer completely within the intervening layer, structure 34 comprises the entire handle layer and optionally a portion of the intervening layer and structure 36 comprises the second structure 26, the device layer 14, and all or a portion of the intervening layer 22.

When present, the residual portion 40 of the handle layer 20 has a thickness (T) that is approximately equivalent to the depth at which ions were implanted into the handle layer 20. Accordingly, this thickness (T) is typically greater than about 10 nm. For example, in some instances the residual layer may optionally be at least bout 20 nm, 50 nm, 75 nm, 100 nm, 200 nm thick or more. Preferably, the thickness (T) is sufficient to avoid damage to the device layer 14 upon separation; for example, in one preferred embodiment, the residual portion is between about 20 nm to about 200 nm thick.

2. Finishing the Multi-layered Crystalline Structure after Layer Transfer

A. Removal of Residual Handle Layer

Figure 4:
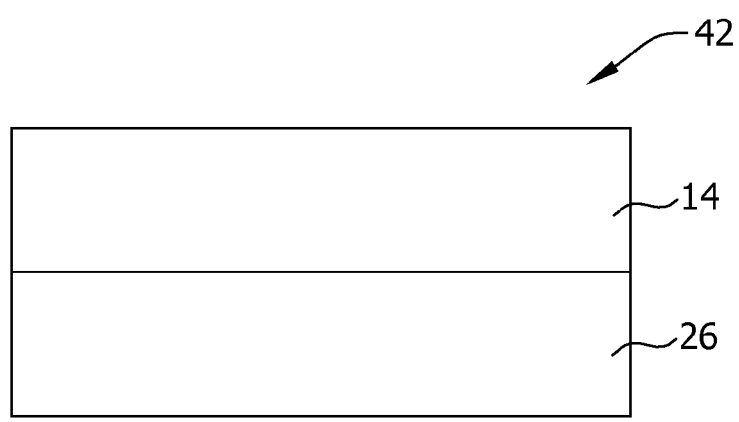
FIG. 4 is a cross-sectional, schematic drawing of the multi-layered crystalline structure of the present invention 42.

In accordance with this invention and referring to FIGS. 3 and 4, after the device layer 14, at least a portion of the intervening layer 22, and optionally a residual portion 40 of handle layer 20 have been transferred to the second structure 26 to form bonded structure 30, bonded structure 30 is subjected to additional processing to produce a multi-layered crystalline structure having desirable features for device fabrication thereon. For example, if a residual portion 40 of handle layer 20 is present, bonded structure 30 may be subjected to one or more processing steps in order to remove this residual portion as well as intervening layer 22. Although essentially any technique known in the art may be used, the residual portion 40 and intervening layer 22 are preferably removed via etching. The etching composition may be selected according to various factors, including the composition of the residual portion 40 of the handle layer 20, the composition of the intervening layer 22, and the selectivity of the etchant. In one embodiment, the entire residual portion 40 of the handle layer 20 and substantially the entire intervening layer 22 are removed via a wet etching process using an etchant comprising $NH_4OH$, $H_2O_2$ and $H_2O$. This etchant is generally know to those skilled in the art and is commonly referred to as an "SC1" solution. Such an etching process is typically carried out at a temperature of from about 50° C. to about 80° C., with the time period of such an etch depending on the thickness of the layer to be removed, the exact composition of the SC1 composition, and the temperature under which the etch is performed. In another embodiment, a KOH solution may be used to remove the handle layer, and an HF solution may be used to remove the intervening layer. Advantageously, the HF solution will remove the intervening layer without roughening the device layer surface. In yet another embodiment, an SC1 solution is used to remove the handle layer and an HF solution is used to remove the intervening layer.

As shown in FIG. 4, the final multi-layered crystalline structure 42 comprises the second structure 26 and the device layer 14. In one preferred embodiment, the final multi-layered crystalline structure 42 comprises a sapphire layer with a silicon layer bonded thereto.

3. Multi-layered Crystalline Structure

The multi-layered crystalline structure prepared in accordance with the present invention may have a substantially uniform thickness ranging from about 300 µm to about 800 µm thick. Preferably, in these or other embodiments, the device layer has a thickness of from about 20 nm to about 200 nm and the second structure has a thickness of from about 300 µm to about 800 µm.

Multi-layered crystalline structures manufactured according to this invention may be used in various technologies. For example, the multi-layered crystalline structure of this invention is suitable for use in the manufacture of a multi-layered microelectric device comprising a microelectric device and the multi-layered crystalline structure of the instant invention. Suitable microelectric devices include, but are not limited to transistors and antenna structures.

What is claimed is:

1. A method for the preparation of a multi-layered crystalline structure, the method comprising:

implanting ions selected from the group consisting of hydrogen, helium and combinations thereof into a silicon-on-insulator structure, wherein the silicon-on-insulator structure comprises a central axis, a device layer having an implantation surface and device surface which are generally perpendicular to the central axis and an average thickness, t, extending in the axial direction from the implantation surface to the device surface of the device layer, a handle layer, and an intervening layer which is positioned along the central axis of the silicon-on-insulator structure between the device surface and the handle layer, wherein the ions are implanted into the silicon-on-insulator structure through the implantation surface to an implantation depth D1 which is greater than the thickness, t, of the device layer to form in the implanted silicon-on-insulator structure a damage layer which is generally perpendicular to the axis and located in the intervening layer and/or in the handle layer;

bonding the implanted silicon-on-insulator structure to a second structure to form a bonded structure;

cleaving the silicon-on-insulator structure along the damaged layer to form a multi-layered crystalline structure comprising the second structure, the device layer and residual material, the residual material comprising at least a portion of the intervening layer and optionally a portion of the handle layer; and, removing the residual material from the multi-layered crystalline structure.

2. The method of claim 1, wherein the ions are implanted using an implant energy of at least about 10 keV.

3. The method of claim 1, wherein the ions are implanted using an implant energy of at least about 80 keV.

4. The method of claim 1, wherein the ions are implanted using an implant energy of up to 120 keV.

5. The method of claim 1, wherein at least about $1\times10^{16}$ ions/cm$^2$ are implanted into the silicon-on-insulator structure.

6. The method of claim 1, wherein at least about $2\times10^{16}$ ions/cm$^2$ are implanted into the silicon-on-insulator structure.

7. The method of claim 1, wherein at least about $1\times10^{17}$ ions/cm$^2$ are implanted into the silicon-on-insulator structure.

8. The method of claim 1, wherein at least about $2\times10^{17}$ ions/cm$^2$ are implanted into the silicon-on-insulator structure.

9. The method of claim 1, further comprising thermally treating the implanted silicon-on-insulator structure to begin the formation of a cleave plane.

10. The method of claim 9, wherein thermally treating the implanted silicon-on-insulator structure comprises heating the implanted silicon-on-insulator structure to a temperature of from about 150° C. to about 300° C. for a period of from about 1 hour to about 100 hours.

11. The method of claim 1, wherein bonding the implanted silicon-on-insulator structure to a second structure comprises thermally treating the bonded structure to strengthen the bond between the silicon-on-insulator structure and the second structure and to form the damage layer.

12. The method of claim 11, wherein thermally treating the bonded structure comprises subjecting the bonded structure to a low temperature thermal anneal.

13. The method of claim 11, wherein the low temperature thermal anneal comprises heating the multi-layered structure to a temperature of from about 150° C. to about 600° C. for a period of from about 1 minute to about 100 hours.

14. The method of claim 1, wherein the device layer comprises a material selected from the group consisting of silicon, silicon carbide, sapphire, germanium, silicon germanium, gallium nitride, aluminum nitride, gallium arsenic, indium gallium arsenic or any combination thereof.

15. The method of claim 1, wherein the intervening layer is a dielectric layer.

16. The method of claim 15, wherein the intervening layer comprises a material selected from the group consisting of silicon dioxide and silicon nitride.

17. The method of claim 1, wherein the handle layer comprises a material that is splittable.

18. The method of claim 17, wherein the handle layer comprises a material selected from the group consisting of silicon, silicon carbide, sapphire, germanium, silicon germanium, gallium nitride, aluminum nitride, gallium arsenic, indium gallium arsenic or any combination thereof.

19. The method of claim 1, wherein the second structure is selected from the group consisting of sapphire, quartz crystal, glass, silicon carbide, silicon, gallium nitride, aluminum nitride, gallium aluminum nitride, gallium arsenic, indium gallium arsenic or any combination thereof.

20. The method of claim 1, wherein implanting the silicon-on-insulator structure comprises implanting atoms selected from the group consisting of helium and hydrogen through the device layer and into the intervening layer of the silicon-on-insulator structure.

21. The method of claim 1, wherein the ions are implanted to depth D1 of at least about 200 Angstroms.

22. The method of claim 1, wherein the ions are implanted to depth D1 of from about 200 Angstroms to about 1 micron beneath the implantation surface.

23. The method of claim 1, wherein the second structure comprises a material selected from the group consisting of sapphire.

24. The method of claim 1, wherein the second structure comprises a multi-layer substrate.

25. The method of claim 1, wherein the method further comprises depositing or growing a bonding layer on at least one of the second structure and the device layer prior to bonding the silicon-on-insulator structure to the second structure.

26. The method of claim 1, wherein the bonded structure consists essentially of the silicon-on-insulator structure and the second structure.

27. The method of claim 1, further comprising forming the silicon-on-insulator structure by bonding a handle wafer to a donor wafer to form a bonded wafer pair and transferring a layer of the donor wafer to the handle wafer.

28. The method of claim 27, wherein the donor wafer is cleaved to transfer the layer of the donor wafer to the handle wafer.

29. The method of claim 1, wherein the ions are implanted to depth D1 of from about 20 nm to about 500 nm beneath the device layer.

* * * * *